(12) United States Patent
Esmael

(10) Patent No.: US 10,924,063 B2
(45) Date of Patent: Feb. 16, 2021

(54) COUPLING A BIAS CIRCUIT TO AN AMPLIFIER USING AN ADAPTIVE COUPLING ARRANGEMENT

(71) Applicant: Analog Devices International Unlimited Company, Limerick (IE)

(72) Inventor: Mohamed Esmael, American Project (EG)

(73) Assignee: Analog Devices International Unlimited Company, Limerick (IE)

( * ) Notice: Subject to any disclaimer, the term of this patent is extended or adjusted under 35 U.S.C. 154(b) by 104 days.

(21) Appl. No.: 16/437,204

(22) Filed: Jun. 11, 2019

(65) Prior Publication Data

US 2020/0395894 A1 Dec. 17, 2020

(51) Int. Cl.
| | | |
|---|---|---|
| *H03G 3/30* | (2006.01) | |
| *H03F 1/02* | (2006.01) | |
| *H03F 3/213* | (2006.01) | |
| *H04B 1/04* | (2006.01) | |

(52) U.S. Cl.
CPC ........... *H03F 1/0211* (2013.01); *H03F 3/213* (2013.01); *H03F 2200/222* (2013.01); *H03F 2200/451* (2013.01); *H03F 2200/465* (2013.01); *H04B 1/04* (2013.01)

(58) Field of Classification Search
CPC .............. H03F 3/04; H03F 3/195; H03G 3/30
USPC .......................................... 330/136, 285, 296
See application file for complete search history.

(56) References Cited

U.S. PATENT DOCUMENTS

| | | | |
|---|---|---|---|
| 6,313,705 B1 | 11/2001 | Dening et al. | |
| 6,803,822 B2 | 10/2004 | Kim et al. | |
| 7,005,923 B2 | 2/2006 | Noh et al. | |
| 7,253,681 B2 | 8/2007 | Ichitsubo et al. | |
| 7,710,204 B2 | 5/2010 | Karoui et al. | |
| 8,026,767 B2 | 9/2011 | Chen et al. | |
| 8,624,678 B2 | 1/2014 | Scott et al. | |
| 9,148,097 B2 * | 9/2015 | Ding ..................... | H03F 1/0266 |

(Continued)

FOREIGN PATENT DOCUMENTS

| | | |
|---|---|---|
| CN | 100488034 | 5/2009 |
| EP | 1429452 | 6/2004 |

OTHER PUBLICATIONS

Noh et al., *An Intelligent Power Amplifier MMIC Using a New Adaptive Bias Control Circuit for W-CDMA Applications*, IEEE Journal of Solid-State Circuits, vol. 39, No. 6, Jun. 2004, 4 pages.

(Continued)

*Primary Examiner* — Steven J Mottola
(74) *Attorney, Agent, or Firm* — Patent Capital Group

(57) ABSTRACT

Bias networks for amplifiers are disclosed. An example bias network includes an adaptive bias circuit, configured to generate a bias signal for an amplifier, and further includes a coupling circuit, configured to couple the adaptive bias circuit to the amplifier. The coupling circuit is made adaptive in that its' impedance depends on a power level of an input signal to be amplified by the amplifier. By configuring the coupling circuit to have a variable impedance that depends on the power level of the input signal, the coupling circuit may adapt to the input power level and, thereby, may modify the bias signal to reduce/optimize at least some of the nonlinearity that may be introduced to the bias signal by the adaptive bias circuit.

24 Claims, 9 Drawing Sheets

(56) References Cited

U.S. PATENT DOCUMENTS

| | | | |
|---|---|---|---|
| 2007/0252646 A1 | 11/2007 | Leung et al. | |
| 2011/0090011 A1* | 4/2011 | Chang | H03F 1/0266 330/296 |
| 2014/0375390 A1 | 12/2014 | Schooley et al. | |
| 2015/0180426 A1 | 6/2015 | Kingsley | |
| 2016/0164469 A1 | 6/2016 | Nobbe et al. | |
| 2018/0294779 A1 | 10/2018 | Allen | |
| 2020/0028477 A1 | 1/2020 | Esmael et al. | |

OTHER PUBLICATIONS

Vasjanov et al., *A Review of Advanced CMOS RF Power Amplifier Architecture Trends for Low Power 5G Wireless Networks*, MDPI electronics, Received Sep. 15, 2018; Accepted Oct. 19, 2018; Published Oct. 23, 2018, 17 pages.

*Third Order Intercept Measurements*, Agilent Technologies, Feb. 15, 2001, 7 pages.

*Current Sense Resistors*, OHMITE® www.ohmite.com, 2 pages.

Jones, *P1dB and P3dB Definitions*, Technical Note 002, Aug. 8, 2014, 2 pages.

Riordan, *Discrete- and Integrated Control of Power Amplifiers in Base-Station Applications*, Analog Dialouge 42-04, Apr. 2008, 4 pages.

Yang et al., *A 5-GHz Band WLAN SiGe HBT Power Amplifier IC with Novel Adaptive-Linearizing CMOS Bias Circuit*, IEICE Trans. Electron., vol. E98-C, No. 7, Jul. 2015, 8 pages.

Yen et al., *A 0.25-μm 20-dBm 2.4-GHz CMOS Power Amplifier with an Integrated Diode Linearizer*, IEEE Microwave and Wireless Components Letters vol. 13, No. 2, Feb. 2003.

He et al., *5.25 GHz Linear CMOS Power Amplifier with a Diode-Connected NMOS Bias Circuit*, 2012.

English translation of CN101141114 of Description and Claims vis Patent Translate, see 12 above.

Office Action mailed in EP20178233.1 dated Oct. 13, 2020, 11 pages.

* cited by examiner

COUPLING A BIAS CIRCUIT TO AN AMPLIFIER USING AN ADAPTIVE COUPLING ARRANGEMENT

TECHNICAL FIELD OF THE DISCLOSURE

The present disclosure generally relates to radio frequency (RF) systems and, more particularly, to bias networks for amplifiers.

BACKGROUND

Radio systems are systems that transmit and receive signals in the form of electromagnetic waves in the RF range of approximately 3 kilohertz (kHz) to 300 gigaHertz (GHz). Radio systems are commonly used for wireless communications, with cellular/wireless mobile technology being a prominent example, but may also be used for cable communications such as cable television. In both of these types of systems amplifiers play a crucial role, e.g., power amplifiers for amplifying RF signals.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
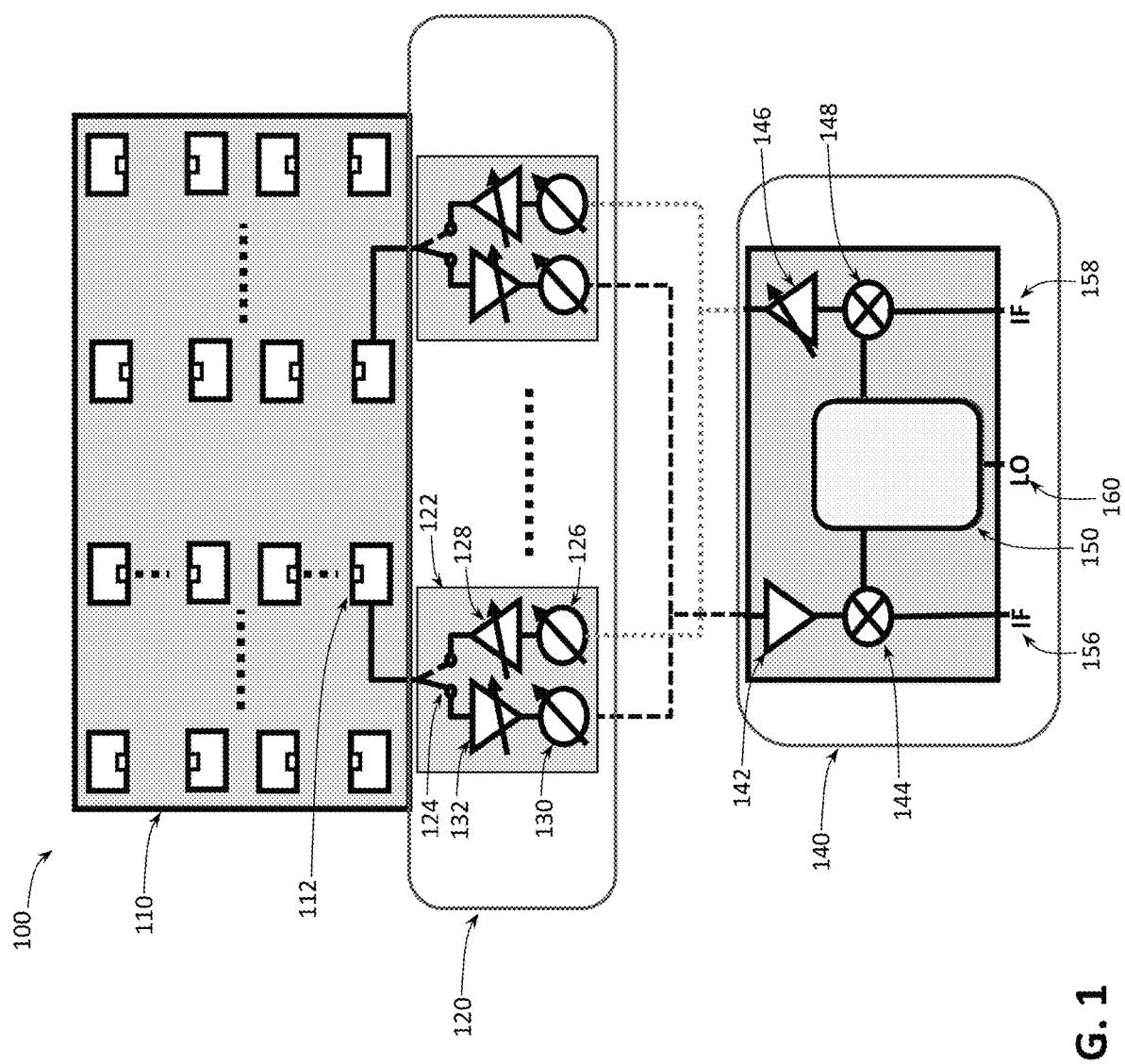
FIG. 1 provides a schematic illustration of an antenna apparatus with a power amplifier that may be biased by a bias network of a bias circuit and an adaptive coupling circuit, according to some embodiments of the present disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating bias networks for amplifiers used in RF systems, proposed herein, it might be useful to first understand phenomena that may come into play in such systems. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of an amplifier being a power amplifier, embodiments of the present disclosure are equally applicable to other types of amplifiers such as low noise amplifiers, linear amplifiers, variable gain amplifiers, etc.

In context of wireless radio systems, an antenna is a device that serves as an interface between radio waves propagating wirelessly through space and electric currents moving in metal conductors used with a transmitter or a receiver. During transmission, a radio transmitter may supply an electric signal, which signal is amplified by a power amplifier, and an amplified version of the signal is provided to antenna's terminals. The antenna may then radiate the energy from the signal output by the power amplifier as radio waves. Similarly, in cable radio systems, an electric signal is first amplified by a power amplifier, prior to transmission over a wired cable connection.

Linear and efficient power amplifiers are essential for modern communication systems, both for wireless radio systems, such as fifth generation cellular technology (5G) systems, and for cable radio systems. Bias circuits that provide bias signals for power amplifiers contribute to linearity and efficiency of power amplifiers. For example, adaptive bias circuits have been developed in an attempt to optimize efficiency of power amplifiers. Such circuits are "adaptive" in that a bias signal provided to a power amplifier is made dependent on a signal that is to be amplified by a power amplifier, which may be advantageous in terms of improving efficiency of the power amplifier. However, the bias circuit itself may inadvertently add nonlinearity to the bias signal, thereby degrading the linearity of the power amplifier. In other words, one drawback of conventional bias circuits, in particular adaptive bias circuits, for power amplifiers is that the power amplifier linearity may degrade due to the bias circuit nonlinearity.

A common conventional approach to providing adaptive biasing to a power amplifier while trying to preserve the linearity of the power amplifier is to implement a bias network that uses a fixed coupling component, such as a fixed resistor, to couple an adaptive bias circuit to the power amplifier. However, the inventor of the present disclosure realized that using a fixed coupling component to couple an adaptive bias circuit to a power amplifier may degrade power and/or efficiency of the power amplifier.

Various embodiments of the present disclosure provide systems and methods that aim to improve on one or more challenges described above in providing linear and efficient amplifiers (such as, but not limited to, power amplifiers, linear amplifiers, low-noise amplifiers, or variable gain amplifiers) for RF systems (such as, but not limited to, phased array antennas of 5G cellular technology or cable communication systems). In one aspect of the present disclosure, an example bias network for an amplifier includes an adaptive bias circuit/arrangement, configured to generate a bias signal for the amplifier, and further includes a coupling circuit/arrangement, configured to couple the adaptive bias circuit to the amplifier to enable provision of the bias signal to the amplifier. In particular, the coupling circuit is configured so that an impedance of the coupling circuit is dependent on a power level of an input signal to be amplified by the amplifier (i.e., the coupling circuit is an adaptive coupling circuit). As described above, the operation of the adaptive bias circuit may introduce some nonlinearity to the bias signal, which nonlinearity may distort the input signal to be amplified by the amplifier. The adaptive coupling circuit described herein is configured to receive, at its' input, the bias signal generated by the adaptive bias circuit. The adaptive coupling circuit is further configured to modify the received bias signal to generate a modified bias signal, where the modified bias signal is then provided to the amplifier. In particular, by configuring the coupling circuit to have a variable impedance that depends on the power level of the input signal to the amplifier, the coupling circuit may adapt to the input power level and, in that manner, may modify the bias signal to reduce or optimize at least some of the nonlinearity introduced to the bias signal by the adaptive bias circuit.

Both the adaptive bias circuit and the adaptive coupling circuit may be seen as "modifying" a bias signal that is used to bias an amplifier, but the modifications provided by each of these two circuits are different. In particular, while the adaptive bias circuit may be configured to make sure that the bias signal is based on the power level at which the amplifier operates, the adaptive coupling circuit may be configured to reduce or eliminate from the bias signal generated by the bias circuit at least some nonlinear components that may be introduced to the bias signal by the bias circuit itself, which may optimize the bias signal in terms of the bias signal degrading the linear behavior of the amplifier. Embodiments of the present disclosure are based on the realization that the nonlinearity of the adaptive bias signal may change according to the input power level (i.e., the power level of the signal to be amplified by the amplifier) and that the level of the nonlinearity in the adaptive bias signal may depend on the impedance between the adaptive bias circuit and the amplifier input. Therefore, providing a bias network for an amplifier where an adaptive coupling circuit may be configured to adapt the impedance between the amplifier input and the adaptive bias circuit according to the input power level may improve (e.g., optimize) the overall linearity of the amplifier.

As will be appreciated by one skilled in the art, aspects of the present disclosure, in particular aspects of bias networks that use adaptive coupling circuits to provide modified bias signals to amplifiers, as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." As least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing bias networks for power amplifiers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Example Antenna Apparatus with an Amplifier Biased Using an Adaptive Coupling Circuit As described above, embodiments of the present disclosure related to bias networks for amplifiers are applicable to wireless as well as cable communication systems. For illustration purposes only, one example communication system/ apparatus (in particular, one example of a wireless communication system/apparatus) that may include one or more amplifiers biased by any of the bias networks described herein is shown in FIG. 1 and described below.

FIG. 1 provides a schematic illustration of an antenna apparatus 100, e.g., a phased array antenna system/apparatus, according to some embodiments of the present disclosure. As shown in FIG. 1, the antenna apparatus 100 may include an antenna array 110, a beamformer array 120, and an up/down converter (UDC) circuit 140. The antenna apparatus 100 may further include one or more low-noise amplifiers 142 and one or more power amplifiers 146, any of which may be biased by any of the bias networks of a bias circuit and an adaptive coupling circuit as described herein.

In general, the antenna array 110 may include one or more, typically a plurality of, antenna elements 112 (only one of which is labeled with a reference numeral in FIG. 1 in order to not clutter the drawing). In various embodiments, the antenna elements 112 may be radiating elements or passive elements. For example, the antenna elements 112 may include dipoles, open-ended waveguides, slotted waveguides, microstrip antennas, and the like. In some embodiments, the antenna elements 112 may include any suitable elements configured to wirelessly transmit and/or receive RF signals. Although FIG. 1 illustrates a certain number of antenna elements 112, it is appreciated that various embodiments may be implemented with an array of any number of two or more antenna elements. Furthermore, although the disclosure may discuss certain embodiments as one type of antenna array, it is understood that the embodiments disclosed herein may be implemented with different types of antenna arrays, such as time domain beamformers, frequency domain beamformers, dynamic antenna arrays, antenna arrays, passive antenna arrays, and the like.

Similarly, the beamformer array 120 may include one or more, typically a plurality of, beamformers 122 (only one of which is labeled with a reference numeral in FIG. 1 in order to not clutter the drawing). The beamformers 122 may be seen as transceivers (e.g., devices which may transmit and/or receive signals, in this case—RF signals) that feed to antenna elements 112. In some embodiments, a single beamformer 122 of the beamformer array 120 is associated with a single antenna element 112 of the antenna array 110 in a one-to-one correspondence (i.e., different beamformers 122 are associated with different antenna elements 112). In other embodiments, more than one beamformers 122 may be associated with a single antenna element 112, e.g., two beamformers 122 may be associated with a single antenna element 112 if, e.g., such antenna element is a dual polarization antenna element.

In some embodiments, each of the beamformers 122 may include a switch 124 to switch the path from the corresponding antenna element 112 to the receiver or the transmitter path. Although not specifically shown in FIG. 1, in some embodiments, each of the beamformers 122 may also include another switch to switch the path from a signal processor (also not shown) to the receiver or the transmitter path. As shown in FIG. 1, in some embodiments, the transmitter path (TX path) of each of the beamformers 122 may include a phase shifter 126 and a variable (e.g., programmable) gain amplifier 128, while the receiver path (RX path) may include a phase adjusted 130 and a variable (e.g., programmable) gain amplifier 132. The phase shifter 126 may be configured to adjust the phase of the RF signal to be transmitted (TX signal) by the antenna element 112 and the variable gain amplifier 128 may be configured to adjust the amplitude of the TX signal to be transmitted by the antenna element 112. Similarly, the phase shifter 130 and the variable gain amplifier 132 may be configured to adjust the RF signal received (RX signal) by the antenna element 112 before providing the RX signal to further circuitry, e.g., to the UDC circuit 140, to the signal processor (not shown), etc. The beamformers 122 may be considered to be "in the RF path" of the antenna apparatus 100 because the signals traversing the beamformers 122 are RF signals (i.e., TX signals which may traverse the beamformers 122 are RF signals upconverted by the UDC circuit 140 from lower frequency signals, e.g., from intermediate frequency (IF) signals or from baseband signals, while RX signals which may traverse the beamformers 122 are RF signals which have not yet been downconverted by the UDC circuit 140 to lower frequency signals, e.g., to IF signals or to baseband signals).

Although a switch is shown in FIG. 1 to switch from the transmitter path to the receive path (i.e., the switch 124), in other embodiments of the beamformer 122, other components can be used, such as a duplexer. Furthermore, although FIG. 1 illustrates an embodiment where the beamformers 122 include the phase shifters 126, 130 (which may also be referred to as "phase adjusters") and the variable gain amplifiers 128, 132, in other embodiments, any of the beamformers 122 may include other components to adjust the magnitude and/or the phase of the TX and/or RX signals. In yet further embodiments, one or more of the beamformers 122 may not include the phase shifter 126 and/or the phase shifter 130 because the desired phase adjustment may, alternatively, be performed using a phase shift module in the LO path. In other embodiments, phase adjustment performed in the LO path may be combined with phase adjustment performed in the RF path using the phase shifters of the beamformers 122.

Turning to the details of the UDC circuit, in general, the UDC circuit 140 may include an upconverter and/or downconverter circuitry, i.e., in various embodiments, the UDC circuit 140 may include 1) an upconverter circuit but no downconverter circuit, 2) a downconverter circuit but no upconverter circuit, or 3) both an upconverter circuit and a downconverter circuit. As shown in FIG. 1, the downconverter circuit of the UDC circuit 140 may include an amplifier 142 and a mixer 144, while the upconverter circuit of the UDC circuit 140 may include an amplifier 146 and a mixer 148. Furthermore, the UDC circuit 140 may further include a phase shift module 150, configured to provide phase shifting in the LO path.

In some embodiments, a single UDC circuit 140 may provide upconverted RF signals to and/or receive RF signals to be downconverted from any one of the beamformers 122. Thus, a single UDC circuit 140 may be associated with a plurality of beamformers 122 of the beamformer array 120 (e.g., there may be 48 beamformers 122 in the beamformer array 120, associated with 48 antenna elements 112 of the antenna array 110). This is schematically illustrated in FIG. 1 with a dashed line and a dotted line connecting various elements of the beamformer array 120 and the UDC circuit 140. Namely, FIG. 1 illustrates that the dashed line may connect the downconverter circuit of the UDC circuit 140 (namely, the amplifier 142) to the RX paths of two different beamformers 122, and that the dotted line may connect the upconverter circuit of the UDC circuit 140 (namely, the amplifier 146) to the TX paths of two different beamformers 122.

The mixer 144 in the downconverter path of the UDC circuit 140 may have, at least, two inputs and one output. The two inputs of the mixer 144 include an input from the amplifier 142, which may, e.g., be a low-noise amplifier, and an input from the phase shift module 150. The amplifier 142 may be biased by any of the bias networks described herein. The one output of the mixer 144 is an output to provide the downconverted signal 156, which may, e.g., be an IF signal 156. The mixer 144 may be configured to receive an RF RX signal from the RX path of one of the beamformers 122, after it has been amplified by the amplifier 142, at its' first input and receive a signal from the phase shift module 150 at its' second input, and mix these two signals to downconvert the RF RX signal to a lower frequency, producing the downconverted RX signal 156, e.g., the RX signal at the IF. Thus, the mixer 144 in the downconverter path of the UDC circuit 140 may be referred to as a "downconverting mixer."

The mixer 148 in the upconverter path of the UDC circuit 140 may have, at least, two inputs and one output. The two inputs of the mixer 148 include an input from the phase shift module 150 and a TX signal 158 of a lower frequency, e.g., the TX signal at IF. The one output of the mixer 148 is an output to the amplifier 146. The amplifier 146 may be a power amplifier biased by any of the bias networks described herein. The mixer 148 may be configured to receive an IF TX signal 158 (i.e., a lower frequency, e.g. IF, signal to be transmitted) at its' first input and receive a signal from the phase shift module 150 at its' second input, and mix these two signals to upconvert the IF TX signal to the desired RF frequency, producing the upconverted RF TX signal to be provided, after it has been amplified by the power amplifier 146, to the TX path of one of the beamformers 122. Thus, the mixer 148 in the upconverter path of the UDC circuit 140 may be referred to as a "upconverting mixer."

As is known in communications and electronic engineering, an IF is a frequency to which a carrier wave may be shifted as an intermediate step in transmission or reception. The IF signal may be created by mixing the carrier signal with an LO signal in a process called heterodyning, resulting in a signal at the difference or beat frequency. Conversion to IF may be useful for several reasons. One reason is that, when several stages of filters are used, they can all be set to a fixed frequency, which makes them easier to build and to tune. Another reason is that lower frequency transistors generally have higher gains so fewer stages may be required. Yet another reason is to improve frequency selectivity because it may be easier to make sharply selective filters at lower fixed frequencies.

It should also be noted that, while some descriptions provided herein refer to signals 156 and 158 as IF signals, these descriptions are equally applicable to embodiments where signals 156 and 158 are baseband signals. In such embodiments, frequency mixing of the mixers 144 and 148 may be a zero-IF mixing (also referred to as a "zero-IF conversion") in which an LO signal used to perform the mixing may have a center frequency in the band of RF RX/TX frequencies.

In some embodiments, the phase shift module 150 in the LO path may be configured to provide a desired phase shift to the LO signal 160, before providing the LO signal to the mixers 144, 148. Thus, in some embodiments, instead of receiving the LO signal 160 (as may be generated by the LO) at one of their inputs, each of the mixers 144, 148 may receive a phase-shifted version of the LO signal 160. Moving the phase shifting operation to the LO path (e.g., between the LO signal generator and the mixers 144, 148), out of the signal path (e.g., between the digital circuitry that handles the signals 156, 158 and antenna elements 112, and in the wireless domain past the antenna elements 112) may advantageously reduce negative impact of phase shifting on the signal quality.

Although not specifically shown in FIG. 1, in further embodiments, the UDC circuit 140 may further include a balancer, e.g., in each of the TX and RX paths, configured to mitigate imbalances in the in-phase and quadrature (IQ) signals due to mismatching.

Furthermore, although also not specifically shown in FIG. 1, in other embodiments, the antenna apparatus 100 may include further instances of a combination of the antenna array 110, the beamformer array 120, and the UDC circuit 140 as described herein.

The antenna apparatus 100 can steer an electromagnetic radiation pattern of the antenna array 110 in a particular direction, thereby enabling the antenna array 110 to generate a main beam in that direction and side lobes in other directions. The main beam of the radiation pattern may be generated based on constructive inference of the transmitted RF signals based on the transmitted signals' phases. The side lobe levels may be determined by the amplitudes of the RF signals transmitted by the antenna elements. The antenna apparatus 100 can generate desired antenna patterns by providing phase shifter settings for the antenna elements 112, e.g., using the phase shift module 150 and/or the phase shifters of the beamformers 122.

As described above, linear and efficient power amplifiers are essential for modern communication systems. Thus, optimizing the power amplifier 146 in terms of its linearity and efficiency would be important for the antenna apparatus 100, as well as for other RF devices, both wireless and cable.

Conventional Bias Networks with Adaptive Bias Circuits

Figure 2A:
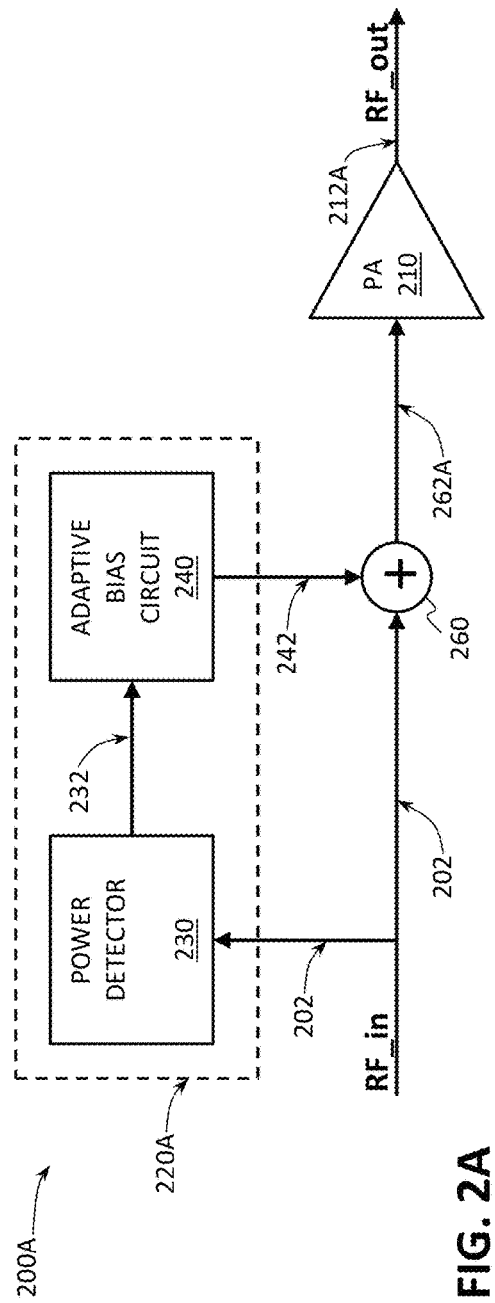
FIG. 2A provides a schematic illustration of a power amplifier with a bias circuit and without a coupling circuit.

FIG. 2A provides a schematic illustration of an RF transmitter (i.e., an RF transmission system) 200A that includes a power amplifier 210 with a bias network 220A that includes a power detector 230 and a bias circuit 240, without any special coupling circuits coupling the bias circuit 240 to the power amplifier 210. In FIG. 2A, as well as in the subsequent drawings, signal RF_in, designated with a reference numeral 202, refers to a signal to be amplified by the power amplifier 210, also sometimes referred to as an "input signal." For example, in some embodiments, the input signal 202 may be an RF TX signal generated by the mixer 148 of the antenna apparatus 100, and the power amplifier 210 may be the power amplifier 146 of the antenna apparatus 100. However, in other embodiments, the input signal 202 may be any signal in RF frequency range that is to be amplified by the power amplifier 210 prior to being transmitted further, either wirelessly or over a wired connection.

The power detector 230 is configured to detect the power of the input signal 202 and provide a signal 232, indicative of the detected power of the input signal 202, to the bias circuit 240. The bias circuit 240 may be an adaptive bias circuit, as shown in FIG. 2A, configured to generate a bias signal 242 that is adapted/modulated based on the input signal envelope power level. The bias signal 242 may then be combined with the input signal 202, as is schematically illustrated in FIG. 2A with a combiner 260 performing said combination, to produce a combined signal 262A that includes the input signal 202 and the bias signal 242. The power amplifier 210 is then configured to amplify the combined signal 262A to generate an amplified RF TX signal 212A, shown in FIG. 2A, as well as in the subsequent drawings, as a signal RF_out. Although combination of the input signal 202 and the bias signal 242 is shown in FIG. 2A to be performed outside of the power amplifier 210, in some embodiments, said combination may be performed within the power amplifier 210. In other words, in some embodiments, instead of the power amplifier 210 receiving a single combined signal 262A as shown in FIG. 2A, the power amplifier 210 may be configured to receive the input signal 202 and the bias signal 242 separately and combine them as a part of performing the amplification to generate the amplified RF TX signal 212.

While the bias network 220A may advantageously allow performing adaptive biasing, the bias circuit 240 may add nonlinearity to the bias signal 242. As a result, the linearity of the power amplifier 210 may degrade due to the nonlinearity of the bias circuit 240. One conventional technique to address this issue is to include a fixed coupling resistor, used to couple the bias circuit 240 to the power amplifier 210, as illustrated in FIG. 2B.

Figure 2B:
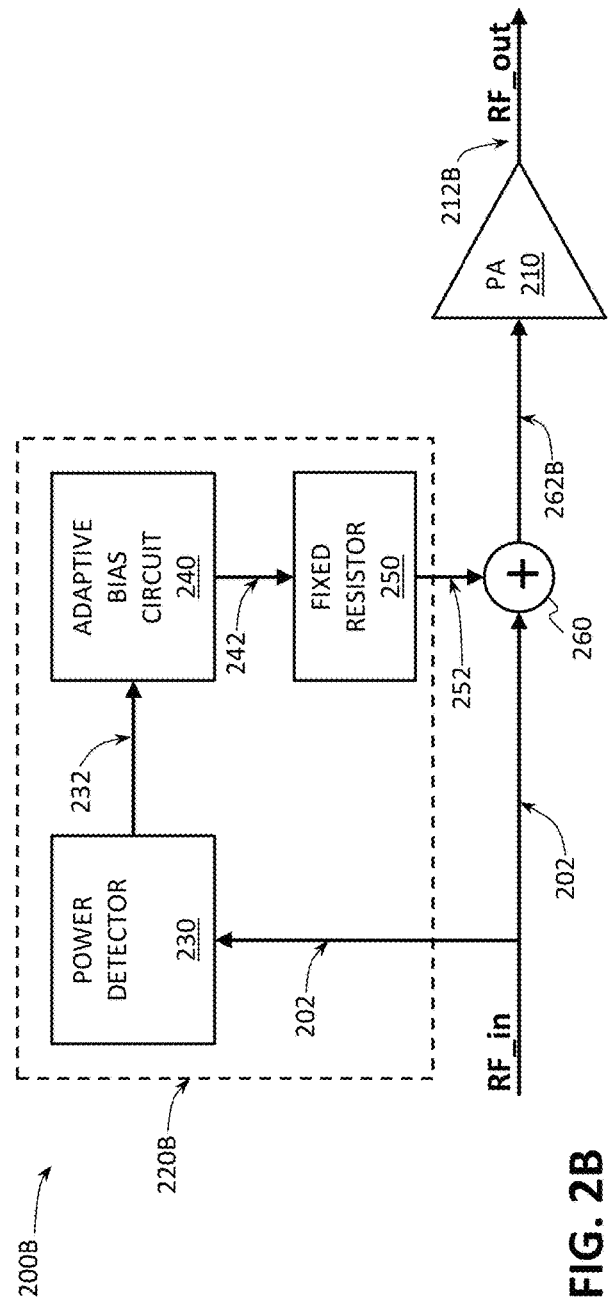
FIG. 2B provides a schematic illustration of a power amplifier with a bias circuit and a fixed coupling circuit, according to some embodiments of the present disclosure.

FIG. 2B provides a schematic illustration of an RF transmitter 200B that includes the power amplifier 210 with the bias network 220B that includes the power detector 230 and the bias circuit 240, as shown in FIG. 2A. In addition, as shown in FIG. 2B, the bias network 220B further includes a fixed resistor 250, between the bias circuit 240 and the power amplifier 210. Elements of FIG. 2B labeled with the same reference numerals as those used in FIG. 2A are used to indicate the same or analogous elements as those described for FIG. 2A. Therefore, in the interests of brevity, their descriptions are not repeated here and only the differences between these figures are described.

As shown in FIG. 2B, instead of the bias signal 242 provided to the power amplifier 210 as is (possibly as a part of a signal that includes a combination of the bias signal 242 and the input signal 202), the bias signal 242 is applied to a first terminal of the fixed resistor 250, resulting in a modified bias signal 252 being output at a second terminal of the fixed resistor 250. The modified bias signal 252 may then be combined with the input signal 202, as is schematically illustrated in FIG. 2B with the combiner 260 performing said combination, to produce a combined signal 262B that includes the input signal 202 and the modified bias signal 252. The power amplifier 210 is then configured to amplify the combined signal 262B to generate an amplified RF TX signal (RF_out) 212B, shown in FIG. 2B. Similar to FIG. 2A, although combination of the input signal 202 and the modified bias signal 252 is shown in FIG. 2B to be performed outside of the power amplifier 210, in some embodiments, said combination may be performed within the power amplifier 210.

In some implementations, the bias network 220B may provide advantages over the bias network 220A in that using the fixed resistor 250 to couple the bias circuit 240 to the power amplifier 210 may at least partially isolate the nonlinearity of the bias circuit 240 from the power amplifier 210 and improve the back-off linearity of the power amplifier 210. As known in the art, in a power amplifier, "back-off" refers to a measure of how far the input power should be reduced in order to realize the desired output linearity and power (e.g., back-off may be measured as a ratio between the input power that delivers maximum power to the input power that delivers the desired linearity).

Figure 3:
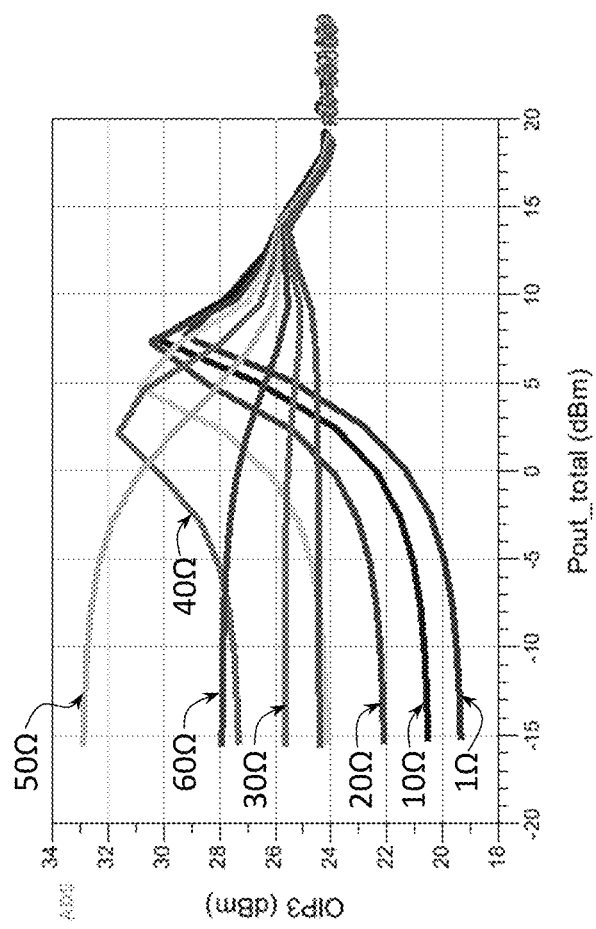
FIG. 3 provides a schematic illustration of how an output of a third-order intercept point (OIP3) may depend on an output power of an amplified RF signal generated by a power amplifier for different resistance values of a resistor used to couple a bias circuit to the power amplifier, according to some embodiments of the present disclosure.

However, inventor of the present disclosure realized that the power, noise performance, and maximum efficiency of the power amplifier 210 may degrade due to the use of the fixed resistor 250. This may be explained with reference to FIG. 3, providing a schematic illustration of how an OIP3 output may depend on an output power of an amplified RF signal (Pout_total) generated by a power amplifier for different resistance values of a resistor used to couple the bias circuit to the power amplifier, according to some embodiments of the present disclosure. Different curves shown in FIG. 3 are associated with different values of a resistor that may couple a bias circuit to a power amplifier, e.g., the fixed resistor 250 shown in FIG. 2B, where resistance values are used to label the different curves. As shown in FIG. 3 for resistance values between 1 and 50 Ohm (Q), at first, the OIP3 output may advantageously increase as the resistance increases, meaning that increasing the value of the fixed resistor 250 may provide advantages in terms of improving linearity of the output power of the power amplifier 210. However, increasing the value of the resistance further may, at some point, result in decreasing the OIP3 output, as is shown in FIG. 3 with a resistance value of 60Ω, for which the OIP3 output is lower than for 50Ω. In circuits with different configurations and at different powers of the input signals, the threshold value at which increasing the resistance further becomes counter-productive, may be different. Thus, inventor of the present disclosure realized that, for a given circuit architecture and a given input power of a signal to be amplified by a power amplifier, there may be some optimum value, or a range of values, of a resistance (or, more generally, an impedance) of a coupling circuit used to couple the output of a bias circuit to an input of the power amplifier. Therefore, being able to adaptively vary this value may be desirable in terms of achieving an improved balance between power, efficiency, and linearity of a power amplifier. Said realization forms the basis for various bias networks with adaptive coupling circuits, described in greater detail below.

Example Bias Network with a Bias Circuit and an Adaptive Coupling Circuit

Figures 4A, 4B:
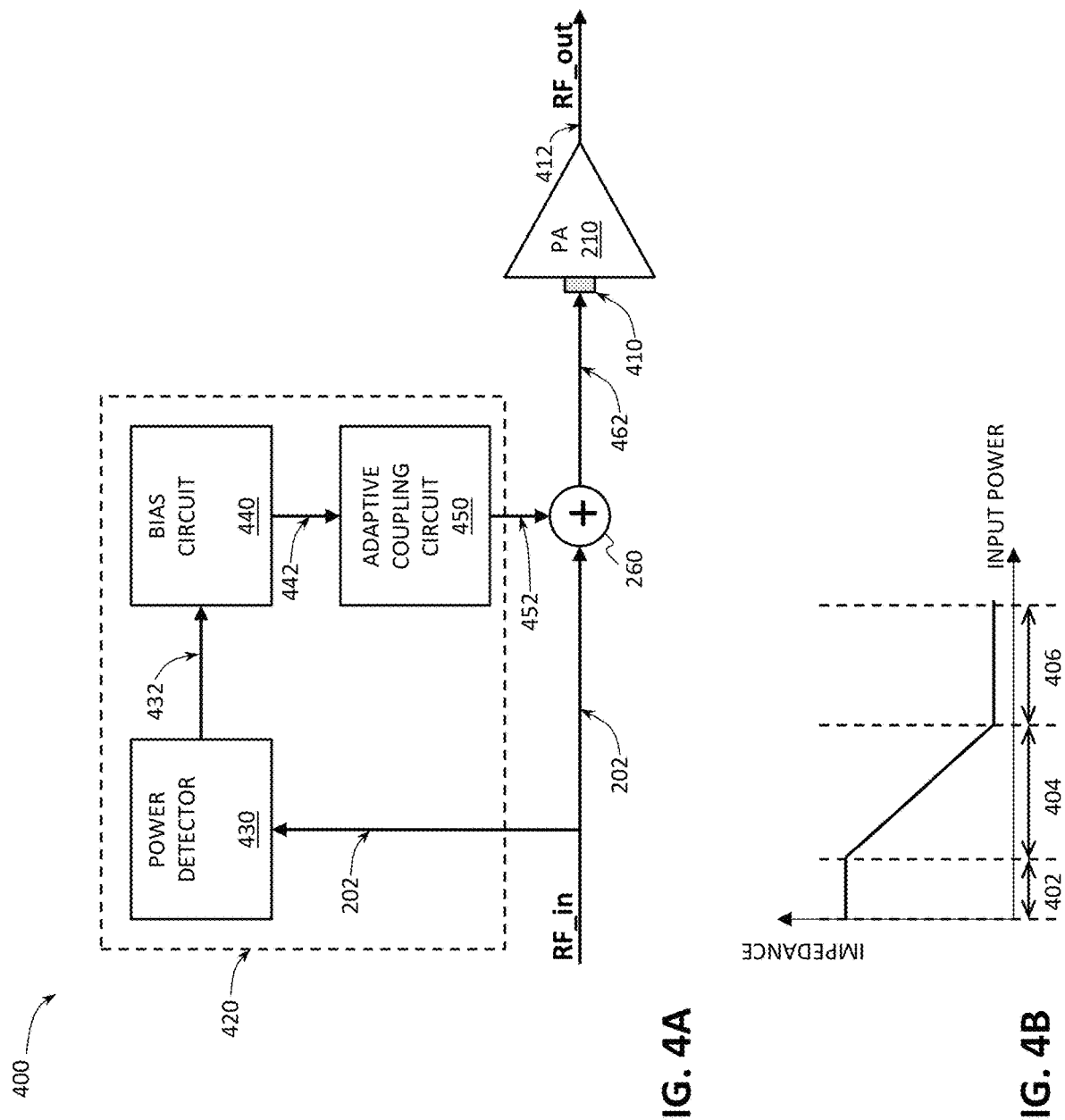
FIG. 4A provides a schematic illustration of a power amplifier with a bias network that includes a bias circuit and an adaptive coupling circuit, according to some embodiments of the present disclosure.
FIG. 4B provides a schematic illustration of how a resistance of an adaptive coupling circuit may depend on an input power to a power amplifier, according to some embodiments of the present disclosure.

FIG. 4A provides a schematic illustration of an RF transmitter 400 that includes the power amplifier 210, as described above, with a bias network 420 that includes a bias circuit 440 and an adaptive coupling circuit 450, according to some embodiments of the present disclosure. In various embodiments, the RF transmitter 400 may be included in, or may be, an RF device. Some examples of such RF devices include, but are not limited to, a mobile device (e.g., a UE of a wireless cellular network), a base station of a wireless cellular network, or an RF transmitter of a cable communications network.

In various embodiments, the power amplifier 210 included in the RF transmitter 400 may include any suitable power amplifier, such as, but not limited to, one of a Doherty power amplifier, a class A power amplifier, a class B power amplifier, a class AB power amplifier, or a class C power amplifier. The power amplifier 210 included in the RF transmitter 400 may be configured to amplify the input signal (RF_in) 202 as described above, to generate an amplified RF TX signal 412 (RF_out).

In various embodiments, the bias circuit 440 may be any suitable bias circuit configured to generate a bias signal 442 for biasing the power amplifier 210. In some embodiments, the bias circuit 440 may be an adaptive bias circuit, configured to generate a bias signal that may depend on the on the power level at which the power amplifier 210 may operate. Various adaptive bias circuits are known in the art and, therefore, in the interests of brevity, their descriptions are not provided here, but any of those circuits may be used as the bias circuit 440. In some embodiments, the bias network 400 may include a power detector 430, configured to receive the income signal 202 and provide a signal 432 to the bias circuit 440, the signal 432 configured to indicate to the bias circuit 440 the level of the power of the input signal 202, as detected by the power detector 430. In some embodiments, the power detector 430 may be a part of the bias circuit 440. In various embodiments, any power detector as used in the art may be used as the power detector 430, such as a peak detector, an envelope detector, a resistor, or even just a short circuit.

The adaptive coupling circuit 450 may be a circuit used for coupling an output of the bias circuit 440 and an input of the power amplifier 210 in a way that the bias signal 442 generated by the bias circuit 440 may be modified, by the adaptive coupling circuit 450, to produce a modified bias signal 452 that may be based not only on the bias signal 442 but also on the input power of the signal 202 to be amplified by the power amplifier 210. To that end, the adaptive coupling circuit 450 may be configured to be such that the impedance (e.g., the resistance) of the adaptive coupling circuit 450 may vary depending on the power of the input signal 202. In some embodiments, the variation may be as schematically illustrated with a curve shown in FIG. 4B, indicating that, in some embodiments, the impedance of the adaptive coupling circuit 450 may be the largest for some value or a first range 402 of values of the input power (i.e., the power of the input signal 202), then gradually decrease for a second range 404 of values of the input power, and, finally, be the smallest for some value or a third range 406 of values of the input power. While FIG. 4B illustrates a linear decrease of the impedance in the second range 404, in various embodiments, the impedance in the second range 404 may decrease according to some other function other than what is shown in FIG. 4B. Configuring the adaptive coupling circuit 450 to adaptively vary its' impedance based on the power of the input signal 202 may enable realizing an improved balance between power, efficiency, and linearity of the power amplifier 210.

The adaptive coupling circuit 450 may be seen as a circuit providing variable level of isolation (e.g., adaptive isolation) between the bias circuit 440 and the power amplifier 210, where the isolation depends on the power of the input signal 202.

At relatively low input powers (e.g., in the first range 402), the adaptive coupling circuit 450 may provide a finite optimal isolation between the bias circuit 440 and the power amplifier 210 where the isolation may control (e.g., reduce or limit) the nonlinearity that may be added by the bias circuit 440. At such input powers, the adaptive coupling circuit 450 may be configured to function as a pre-distortion circuit that may be configured to reduce or cancel the nonlinearity of the power amplifier 210 at back-off power levels. To that end, at low input powers, the adaptive coupling circuit 450 may be configured to provide a relatively high isolation which means the impedance of the adaptive coupling circuit 450 may be relatively high, as illustrated in FIG. 4B. For example, in some embodiments, at relatively low input power levels, the adaptive coupling circuit 450 may be configured to have a resistance between about 40Ω and 60Ω, including all values and ranges therein.

On the other hand, at relatively high input powers (e.g., in the third range 406), the adaptive coupling circuit 450 may be configured to provide minimum or even no isolation between the bias circuit 440 and the power amplifier 210, which may advantageously allow increasing the output power and efficiency of the power amplifier 210. In some embodiments, at such high input powers, e.g., near a 1 decibel (dB) compression point (P1 dB) power level, the adaptive coupling circuit 450 may be configured to act as a short circuit (where the P1 dB may refer to the output power level at which the gain of the power amplifier 210 may decrease 1 dB from its constant value). This means that, at relatively high input powers, the impedance of the adaptive coupling circuit 450 may be relatively low, as also illustrated in FIG. 4B. For example, in some embodiments, at relatively high input power levels, the adaptive coupling circuit 450 may be configured to have a resistance between about 1Ω and 30Ω, including all values and ranges therein.

The adaptive coupling circuit 450 may modify the bias signal 442 generated by the bias circuit 440 to generate the modified bias signal 452 that signal is based on the bias signal 442 and further based on a power level of the input signal 202. The modified bias signal 452 may then be combined with the input signal 202, as is schematically illustrated in FIG. 4 with the combiner 260 performing said combination, to produce a combined signal 462 that includes the input signal 202 and the modified bias signal 452. The power amplifier 210 is then configured to amplify the combined signal 462 to generate an amplified RF TX signal 412 (RF_out). Again, although combination of the input signal 202 and the modified bias signal 452 is shown in FIG. 2A to be performed outside of the power amplifier 210, in some embodiments, said combination may be performed within the power amplifier 210. In other words, in some embodiments, instead of the power amplifier 210 receiving a single combined signal 462 as shown in FIG. 4, the power amplifier 210 may be configured to receive the input signal 202 and the modified bias signal 452 separately and combine them as a part of performing the amplification to generate the amplified RF TX signal 412. Thus, in general, in various embodiments, the input signal 202 and the modified bias signal 452 may be provided to an input 410 of the power amplifier 210, either together as the combined signal 462, or as separate signals.

Implementing the adaptive coupling circuit 450 as described herein may improve P1 dB and the linearity of the power amplifier 210, e.g., by realizing an adaptive isolator between the bias circuit 440 and the power amplifier 210 that may control the isolation value based on the input power range. In some embodiments, the isolation level of the adaptive coupling circuit 450 may be high at relatively low input power levels to isolate the nonlinearity of the bias circuit 440 and improve the back-off OIP3 of the power amplifier 210. In some embodiments, the isolation level of the adaptive coupling circuit 450 may decrease at higher input powers to, e.g., enable bias ramping and improve the P1 dB, high power linearity, and efficiency of the power amplifier 210.

There are many different approaches to how the adaptive coupling circuit 450 may be implemented to function in accordance with the principles described herein, all of which being within the scope of the present disclosure. For example, in some embodiments, the adaptive coupling circuit 450 may be implemented as an adaptive resistor configured so that the resistance value of the resistor depends on the power level of the input signal 202 as described herein. For example, in some embodiments, the resistance of such an adaptive resistor may be about 50Ω at relatively low input power levels, e.g., to isolate the nonlinear distortion that may be introduced by the bias circuit 440 from the input of the power amplifier 210, e.g., in order to reduce, minimize, or avoid affecting the PA back-off OIP3 of the power amplifier 210. Furthermore, in some embodiments, the resistance of such an adaptive resistor may be about, e.g., 2Ω at relatively high input power levels, e.g., to improve the P1 dB, high power linearity and efficiency of the power amplifier 210.

Figure 5:
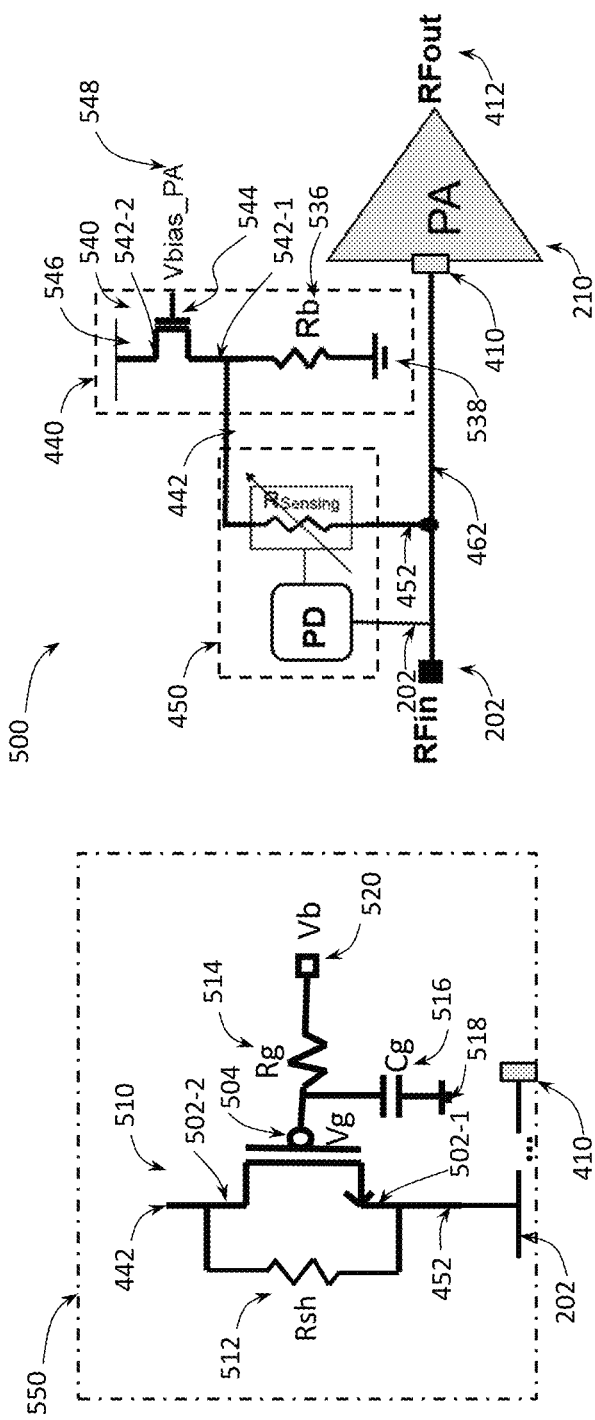
FIG. 5 provides a schematic illustration of an adaptive coupling circuit implemented using a P-type metal-oxide-semiconductor (PMOS) transistor, according to some embodiments of the present disclosure.
Figure 6:
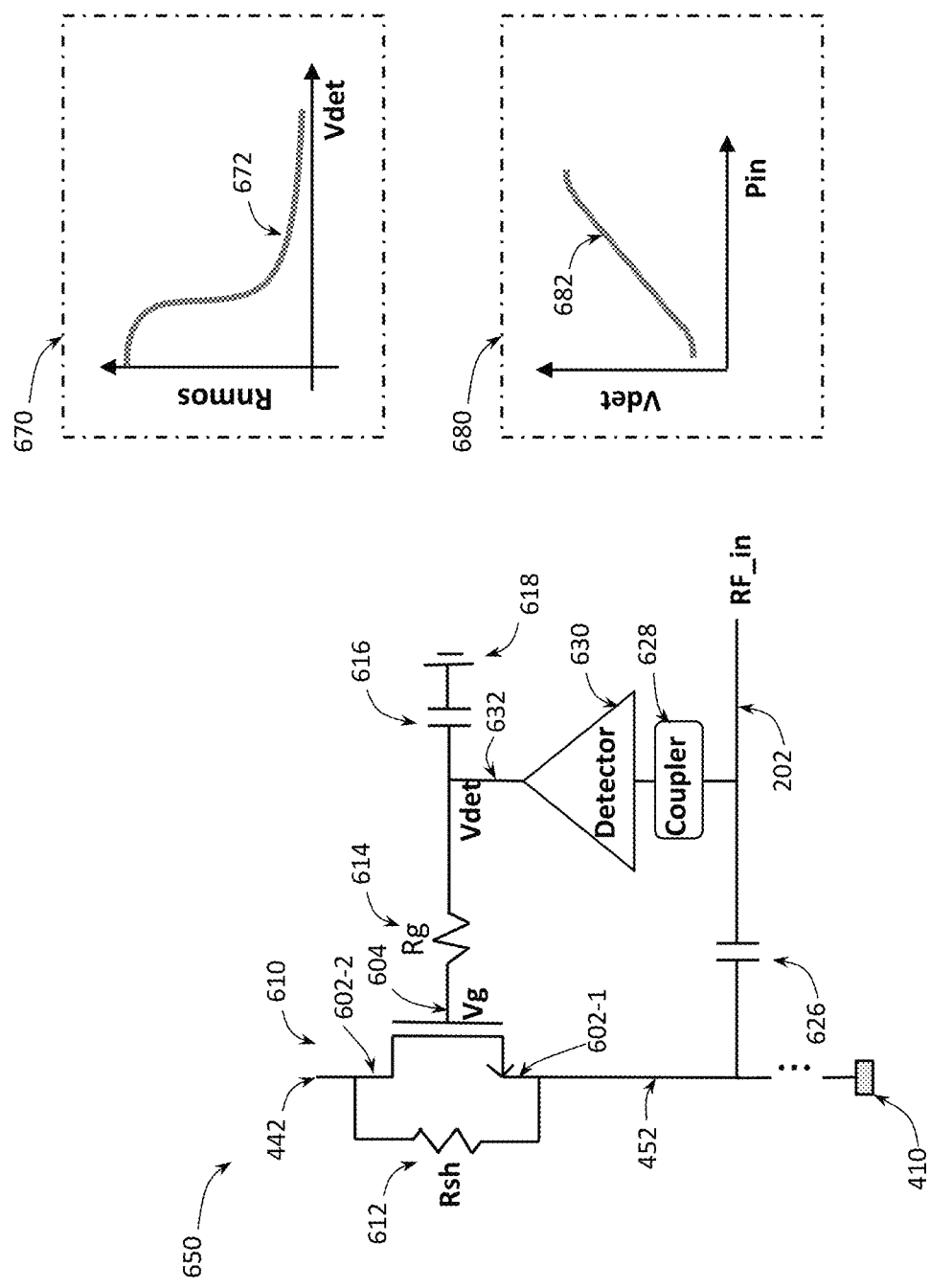
FIG. 6 provides a schematic illustration of an adaptive coupling circuit implemented using an N-type metal-oxide-semiconductor (NMOS) transistor, according to some embodiments of the present disclosure.
Figure 7:
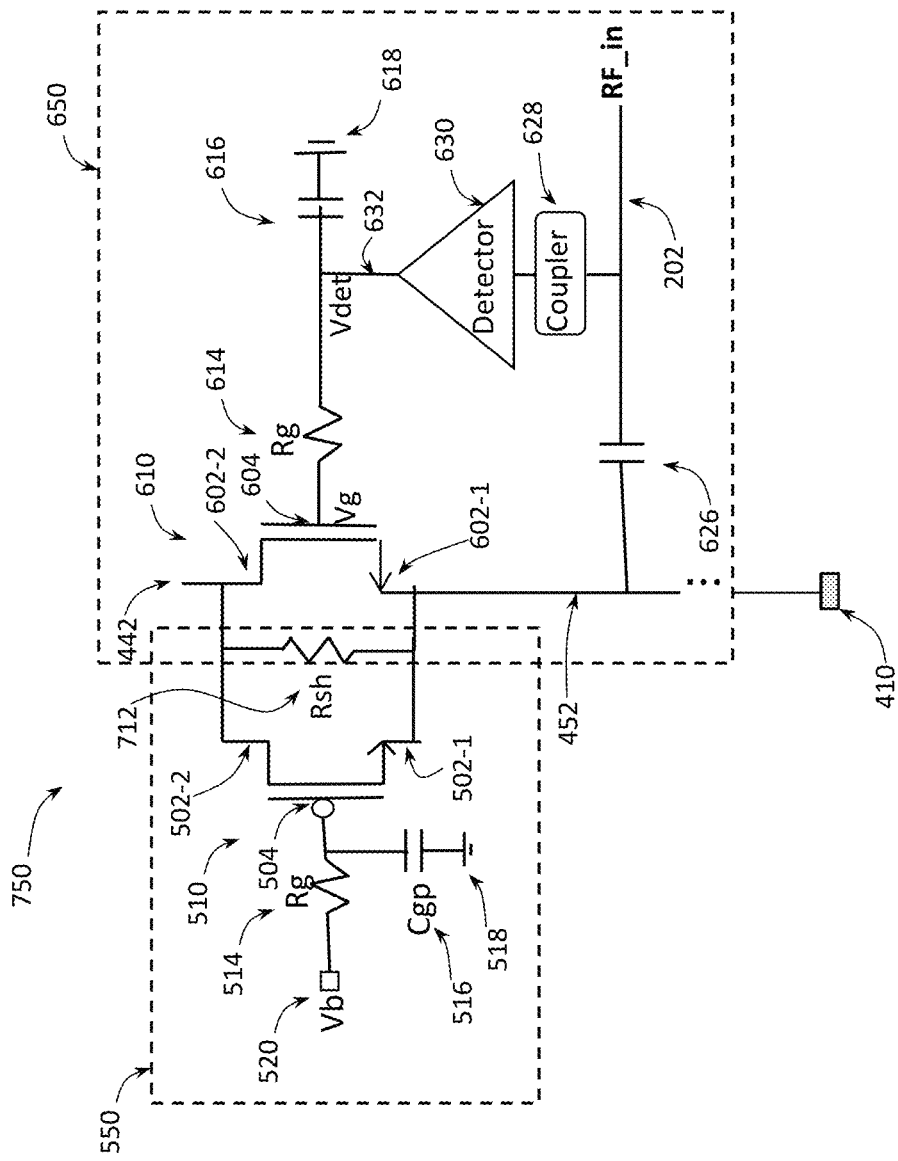
FIG. 7 provides a schematic illustration of an adaptive coupling circuit implemented using a PMOS transistor and an NMOS transistor, according to some embodiments of the present disclosure.

Some example embodiments of how the adaptive coupling circuit 450 may be implemented are illustrated in FIGS. 5-7, described below.

Example Implementations of an Adaptive Coupling Circuit

FIG. 5 provides a schematic illustration of a first example of an RF transmitter 500 that includes the power amplifier 210 and the bias network 420 that includes the bias circuit 440 and the adaptive coupling circuit 450 as described above (i.e., the RF transmitter 500 is a first example implementation of the RF transmitter 400 shown in FIG. 4, where the same reference numerals in FIGS. 4 and 5 refer to the same or analogous elements as those described with reference to FIG. 4, so that, in the interests of brevity, descriptions of these elements provided with respect to FIG. 4 are not repeated here). The example of FIG. 5 illustrates that the adaptive coupling circuit 450 may be implemented using a PMOS transistor, according to some embodiments of the present disclosure, where the details of such an example of the adaptive coupling circuit 450 as shown in FIG. 5 within an inset 550, outlined in FIG. 5 with a dotted-dashed contour.

As shown in FIG. 5, in some embodiments, the adaptive coupling circuit 450 may include a transistor 510, having a pair of source and drain (S/D) terminals 502-1 and 502-2, and a gate terminal 504. Thus, the transistor 510 is a FET. As is known, for FETs, the designation of which terminal of the part of S/D terminals is a source terminal and which terminal is a drain terminal is interchangeable. Therefore, these terminals may be referred to as a first S/D terminal 502-1 and a second S/D terminal 502-2, where, in some embodiments, the first S/D terminal 502-1 may be a source terminal and the second S/D terminal 502-2 may be a drain terminal, while, in other embodiments, the first S/D terminal 502-1 may be a drain terminal and the second S/D terminal 502-2 may be a source terminal.

In some embodiments, the first S/D terminal 502-1 of the transistor 510 may be coupled to the input signal 202 and to the input 410 of the power amplifier 210 (possibly with the combiner 260 in between, as shown in FIG. 4), while the second S/D terminal 502-2 may be coupled to the output 442 of the bias circuit 440, as shown in FIG. 5. In the example shown in FIG. 5, the transistor 510 is a PMOS transistor. Because PMOS transistors inherently exhibit resistance that is dependent on the voltage on one of their S/D terminals (in addition to depending on the voltage on gate terminal, e.g., PMOS resistance may depend on the source-gate voltage VSG), coupling one of the S/D terminals of a PMOS transistor to the input signal 202 that is to be amplified by the power amplifier 210 results in the voltage on that S/D terminal being dependent on the input signal 202, which effectively makes resistance of the PMOS transistor dependent on the input signal (in particular, dependent on the power of the input signal). In turn, having resistance of the PMOS transistor depend on the power of the input signal may modify the bias signal generated by the bias circuit as to reduce or optimize at least some of the nonlinearity introduced to the bias signal by the bias circuit, which modified bias signal may then be applied to the power amplifier. Consequently, during operation, a current flowing between the first S/D terminal 502-1 and the second S/D terminal 502-2 of the transistor 510 is dependent on the power of the input signal 202 because of the dependence of that current on the resistance of the PMOS transistor 510. As a result, the modified bias signal 452 may be seen as the signal at the first S/D terminal 502-1 of the transistor 510.

As also shown in FIG. 5, in addition to the transistor 510, the adaptive coupling circuit 450 may further include a resistor 512, which may be coupled between the first S/D terminal 502-1 and the second S/D terminal 502-2 of the transistor 510. The resistor 512 may be referred to as a "shunt resistor." Including the resistor 512 may advantageously allow controlling the coupling between the power amplifier 210 and the adaptive bias circuit 440 (e.g., setting the minimum desired coupling). For example, such a resistor may set the maximum resistance of the adaptive coupling circuit 450 that may be useful at low input power operation.

As also shown in FIG. 5, the gate terminal Vg 504 of the transistor 510 may be coupled to a bias voltage Vb 520 (e.g., a bias voltage from a current mirror, from a resistor divider, etc.), e.g., optionally via or associated with a resistor Rg 514, and may also be coupled to a ground potential 518, e.g., optionally via or associated with a capacitor Cg 516. Each of the resistor 514 and the capacitor 516 are optional; if used, then, in some implementations, their values may be optimized to, e.g., allow some swing on the PMOS gate to control the slope of its resistance.

FIG. 5 illustrates one particular example of the bias circuit 440, as a circuit that includes a transistor 540 and a resistor Rb 536, although in other embodiments other implementations of the bias circuit 440 are possible and are within the scope of the present disclosure. As shown in FIG. 5, in such an embodiment of the bias circuit 440, a first S/D terminal 542-1 of the transistor 540 may be coupled to a first terminal of the resistor 536, while a second terminal of the resistor 536 may be coupled to a ground potential 538. As further shown in FIG. 5, in such an embodiment of the bias circuit 440, a second S/D terminal 542-2 of the transistor 540 may be coupled to VDD 546, while a gate terminal 544 of the transistor 540 may be coupled to a Vbias_PA 548 (a bias voltage applied to the adaptive bias). In some embodiments, Vbias_PA 548 could be generated from a bandgap circuit or a constant gm (transconductance) bias circuit.

FIG. 6 provides a schematic illustration of an adaptive coupling circuit 650 implemented using an NMOS transistor 610, according to some embodiments of the present disclosure. The adaptive coupling circuit 650 is a second example of the adaptive coupling circuit 450 of the RF transmitter 400, described above, where the same reference numerals in FIGS. 4 and 6 refer to the same or analogous elements as those described with reference to FIG. 4, so that, in the interests of brevity, descriptions of these elements provided with respect to FIG. 4 are not repeated here.

Similar to the transistor 510 shown in FIG. 5, in some embodiments, the transistor 610 may include a pair of S/D terminals 602-1 and 602-2 and a gate terminal 604. Also similar to the transistor 510 shown in FIG. 5, as shown in FIG. 6, in some embodiments, the first S/D terminal 602-1 of the transistor 610 may be coupled to the input signal 202 and to the input 410 of the power amplifier 210 (possibly with the combiner 260 in between, as shown in FIG. 4), while the second S/D terminal 602-2 may be coupled to the output 442 of the bias circuit 440. In contrast to FIG. 5, in the example shown in FIG. 6, the transistor 610 is an NMOS transistor and the adaptive coupling circuit 650 may further include a power detector 630, configured to determine a power of the input signal 202, e.g., by virtue of an input of the power detector 630 being coupled to the input signal 202, as shown in FIG. 6. In some embodiments, the power detector 630 may be coupled to the input signal 202 using a coupler 628, such as a resistor or a magnetic coupler. In some embodiments, the power detector 630 may include a peak power detector, an envelope power detector, an RMS power detector, etc. The power detector 630 is configured to generate a signal 632, indicative of the power of the input signal 202. In turn, the voltage Vg applied to the gate terminal 604 of the transistor 610 may be configured to be based on the signal 632 (e.g., by coupling the output 632 of the power detector 630 to the gate terminal 604, e.g., via a resistor Rg 614, as shown in FIG. 6) and, thus, dependent on the power of the input signal 202. Making the gate voltage Vg of the NMOS transistor 610 dependent on the power of the input signal 202 as determined by the power detector 630 results in the resistance of the NMOS transistor 610, defining how much current can flow between its' source and drain terminals 602, being dependent on the power level of the input signal 202. By configuring the adaptive coupling circuit 650 to have a variable resistance that depends on the power level of the input signal 202 to be amplified by the power amplifier 210, the adaptive coupling circuit 650 may modify the bias signal 442 to generate the modified bias signal 452, e.g., at the first S/D terminal 602-1, in which at least some of the nonlinearity introduced to the bias signal 442 by the adaptive bias circuit 440 has been reduced or compensated.

As also shown in FIG. 6, similar to FIG. 5, in addition to the transistor 610, the adaptive coupling circuit 650 may further include a resistor 612, which may be coupled between the first S/D terminal 602-1 and the second S/D terminal 602-2 of the transistor 610. Similar to the resistor 512, including the resistor 612 may advantageously allow controlling the coupling between the power amplifier 210 and the adaptive bias circuit 440 (e.g., setting the minimum desired coupling). For example, the resistor 612 may be used to set the maximum resistance of the adaptive coupling circuit 650 that may be useful at low input power operation.

FIG. 6 further illustrates that the gate terminal 604 of the transistor 610 may further be coupled to a ground potential 618, possibly via a capacitor 616 between the resistor Rg 614 and the ground potential 618. In addition, as also shown in FIG. 6, in some embodiments, the input 202 may be coupled to the first S/D terminal 602-1 via a capacitor 626. If used, the resistor 614 and the capacitor 626 may be used to filter the output signal from the detector and define the NMOS gate impedance that may allow some swing on the NMOS gate. In some embodiments, the capacitor 626 may be replaced with a short circuit.

FIG. 6 also shows two insets, 670 and 680 (within dash-dotted contours shown in FIG. 6), which may help explain some further details of implementing the adaptive coupling circuit 450 using an NMOS transistor and a power detector as, e.g., shown with the example of the adaptive coupling circuit 650. The inset 670 illustrates a curve 672, providing an example of how the resistance of the NMOS transistor 610 (indicated as "Rnmos" on the y-axis of the coordinate system shown in the inset 670) may vary depending on the power level of the input signal 202 as detected by the power detector 630 (indicated as "Vdet" (e.g., voltage output of the detector 630) on the x-axis of the coordinate system shown in the inset 670). The curve 672 illustrates that the resistance Rnmos may decrease as the power of the input signal 202 increases, but not in a linear manner. The inset 680 illustrates a curve 682, providing an example of how the output 632 of the power detector 630 (indicated as "Vdet" on the y-axis of the coordinate system shown in the inset 680) may depend on the input power level of the input signal 202 (indicated as "Pin" on the x-axis of the coordinate system shown in the inset 680). The curve 682 illustrates that the power detector output Vdet may increase as the power of the input signal 202 increases.

FIG. 7 provides a schematic illustration of an adaptive coupling circuit 750 implemented using both a PMOS transistor and an NMOS transistor, according to some embodiments of the present disclosure. The adaptive coupling circuit 750 is a third example of the adaptive coupling circuit 450 of the RF transmitter 400, described above, where the same reference numerals in FIGS. 4 and 7 refer to the same or analogous elements as those described with reference to FIG. 4, so that, in the interests of brevity, descriptions of these elements are not repeated here. Furthermore, in some embodiments, the PMOS transistor of the adaptive coupling circuit 750 may be implemented as the PMOS transistor 510 as shown in FIG. 5 and/or the NMOS transistor of the adaptive coupling circuit 750 may be implemented as the NMOS transistor 610 as shown in FIG. 6, described above. Therefore, the same reference numerals in FIGS. 5, 6, and 7 refer to the same or analogous elements as those described with reference to FIGS. 5 and 6, so that, in the interests of brevity, descriptions of these elements provided with respect to FIGS. 5 and 6 are not repeated here.

FIG. 7 illustrates an embodiment where the adaptive coupling circuit 550 with the PMOS transistor 510 is combined with the adaptive coupling circuit 650 with the NMOS transistor 610, where the illustration is self-explanatory because of the consistent use of the same illustrations and reference numerals as those used in FIGS. 5 and 6. The only aspect that is different in FIG. 7 is that what used to be the resistor 512 in the adaptive coupling circuit 550 and what used to be the resistor 612 in the adaptive coupling circuit 650 is now replaced with a single resistor 712, shared between the PMOS 510 and the NMOS 610. Thus, the resistor 712 may be coupled between the first S/D terminal 502-1 and the second S/D terminal 502-2 of the PMOS transistor 510 as well as the first S/D terminal 602-1 and the second S/D terminal 602-2 of the NMOS transistor 610.

Including both the PMOS and the NMOS transistors 510, 610 within the adaptive coupling circuit 750 advantageously allows ensuring that the resistance of the coupling circuit 750 is dependent on the power of the input signal not only because the PMOS transistor 510 will inherently depend on said power when one of its'S/D terminals is coupled to the input signal 202, but also because the NMOS transistor 610 together with the power detector 630 may provide an additional level of dependency on said power, e.g., when having the gate voltage of the NMOS transistor 620 being based on the power as measured by the power detector 630.

Figure 8:
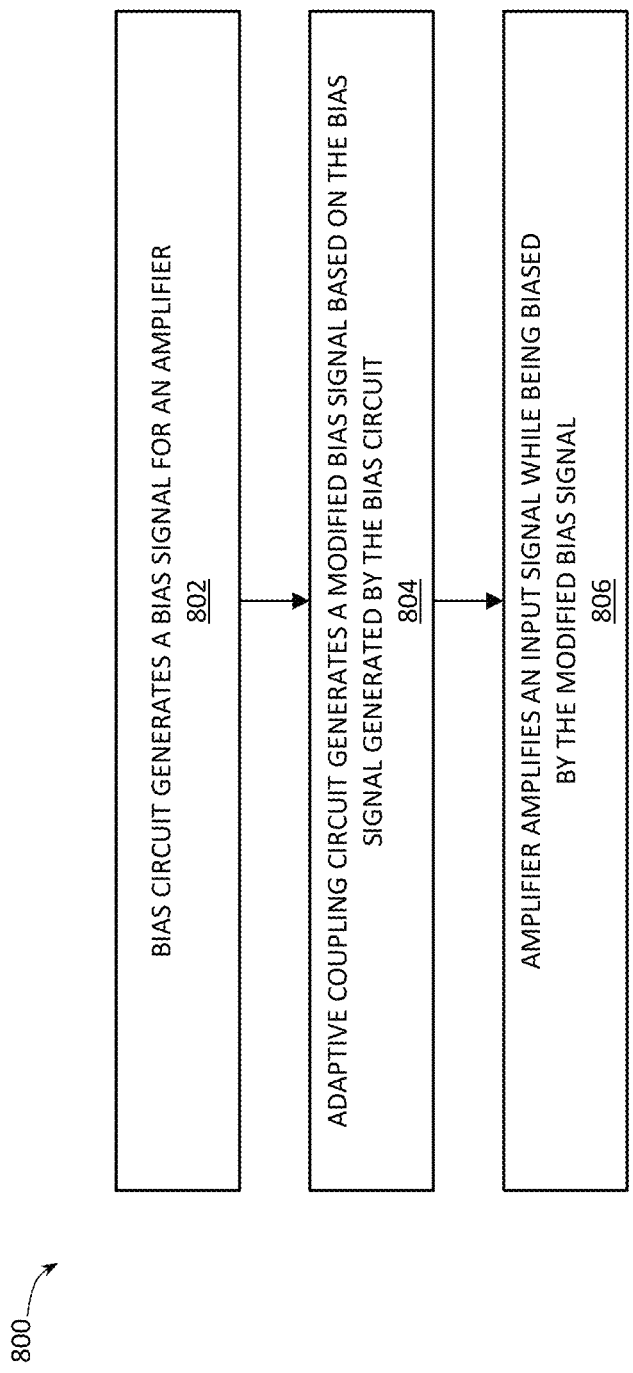
FIG. 8 provides a block diagram illustrating a method for amplifying an input signal using a power amplifier coupled to a bias circuit using an adaptive coupling circuit, according to some embodiments of the present disclosure.

Operating an Amplifier Biased by a Bias Network with an Adaptive Coupling Circuit FIG. 8 provides a block diagram illustrating a method 800 for amplifying an input signal using a power amplifier coupled to a bias circuit using an adaptive coupling circuit, according to some embodiments of the present disclosure. Although some operations of the method 800 are described with reference to the system components shown in FIG. 4, in general, any system configured to perform these operations, in any order, is within the scope of the present disclosure. In some embodiments, a control logic associated with the RF transmitter 400 may be configured to control the operations of the method 800.

The method 800 may begin, at 802, with a bias circuit generating a bias signal for a power amplifier. For example, at 802, the adaptive bias circuit 440 may be configured to generate the bias signal 442 for the power amplifier 210, as described above.

Next, at 804, an adaptive coupling circuit may generate a modified bias signal based on the bias signal generated by the bias circuit at 802 and further based on the power of an input signal to be amplified by the power amplifier. For example, at 804, the adaptive coupling circuit 450 may be configured to generate the modified bias signal 452 based on the bias signal 442 and based on the power of the input signal 202, as described above.

At 806, the power amplifier may amplify the input signal while being bias by the modified bias signal generated at 804. For example, at 806, the power amplifier 210 may amplify the input signal 202 while being bias by (e.g., combined with) the modified bias signal 452 generated at 804, to generate the amplified RF TX signal 412.

Although not shown in FIG. 8, the method 800 may further include the RF transmitter 400 transmitting the amplified RF TX signal 412 generated by the power amplifier 210 at 806.

Example Data Processing System

Figure 9:
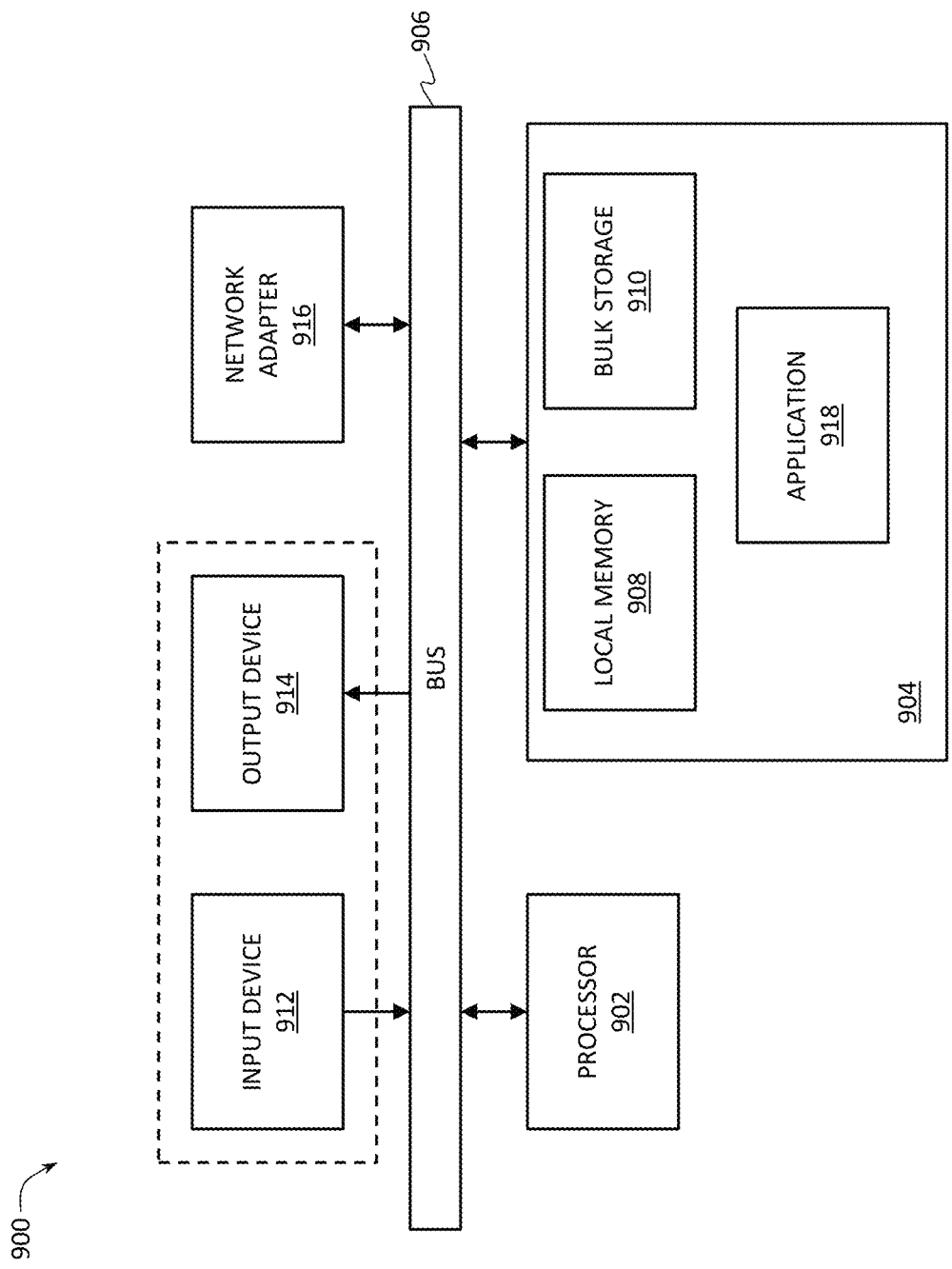
FIG. 9 provides a block diagram illustrating an example data processing system that may be configured to implement, or control, at least portions of amplifying an input signal using a power amplifier coupled to a bias circuit using an adaptive coupling circuit, according to some embodiments of the present disclosure.

FIG. 9 provides a block diagram illustrating an example data processing system 900 that may be configured to implement, or control implementations of, at least portions of bias networks that use adaptive coupling circuits to provide modified bias signals to power amplifiers as described herein, e.g., of the bias networks as described with reference to FIGS. 4-8, according to some embodiments of the present disclosure. For example, in some embodiments, the data processing system 900 may implement a control logic configured to control at least portions of implementing the bias networks that use adaptive coupling circuits as described herein.

As shown in FIG. 9, the data processing system 900 may include at least one processor 902, e.g. a hardware processor 902, coupled to memory elements 904 through a system bus 906. As such, the data processing system may store program code within memory elements 904. Further, the processor 902 may execute the program code accessed from the memory elements 904 via a system bus 906. In one aspect, the data processing system may be implemented as a computer that is suitable for storing and/or executing program code. It should be appreciated, however, that the data processing system 900 may be implemented in the form of any system including a processor and a memory that is capable of performing the functions described within this disclosure.

In some embodiments, the processor 902 can execute software or an algorithm to perform the activities as discussed in this specification, in particular activities related to implementing and/or operating bias networks that use adaptive coupling circuits to provide modified bias signals to power amplifiers as described herein. The processor 902 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 902 may be communicatively coupled to the memory element 904, for example in a direct-memory access (DMA) configuration, so that the processor 902 may read from or write to the memory elements 904.

In general, the memory elements 904 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 900 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 4-7, can also include suitable interfaces for receiving, transmitting, and/or otherwise communicating data or information in a network environment so that they can communicate with, e.g., the data processing system 900 of another one of these elements.

In certain example implementations, mechanisms for implementing bias networks that use adaptive coupling circuits to provide modified bias signals to power amplifiers as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 904 shown in FIG. 9, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 902 shown in FIG. 9, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 904 may include one or more physical memory devices such as, for example, local memory 908 and one or more bulk storage devices 910. The local memory may refer to RAM or other non-persistent memory device(s) generally used during actual execution of the program code. A bulk storage device may be implemented as a hard drive or other persistent data storage device. The processing system 900 may also include one or more cache memories (not shown) that provide temporary storage of at least some program code in order to reduce the number of times program code must be retrieved from the bulk storage device 910 during execution.

As shown in FIG. 9, the memory elements 904 may store an application 918. In various embodiments, the application 918 may be stored in the local memory 908, the one or more bulk storage devices 910, or apart from the local memory and the bulk storage devices. It should be appreciated that the data processing system 900 may further execute an operating system (not shown in FIG. 9) that can facilitate execution of the application 918. The application 918, being implemented in the form of executable program code, can be executed by the data processing system 900, e.g., by the processor 902. Responsive to executing the application, the data processing system 900 may be configured to perform one or more operations or method steps described herein.

Input/output (I/O) devices depicted as an input device 912 and an output device 914, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 914 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 914. Input and/or output devices 912, 914 may be coupled to the data processing system either directly or through intervening I/O controllers.

In an embodiment, the input and the output devices may be implemented as a combined input/output device (illustrated in FIG. 9 with a dashed line surrounding the input device 912 and the output device 914). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 916 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 900, and a data transmitter for transmitting data from the data processing system 900 to said systems, devices and/or networks. Modems, cable modems, and Ethernet cards are examples of different types of network adapter that may be used with the data processing system 900.

SELECT EXAMPLES

Example 1 provides a bias network for an amplifier, where the amplifier may be one of a power amplifier (e.g., a Doherty amplifier, a class A amplifier, a class B amplifier, a class AB amplifier, or a class C amplifier), a linear amplifier, a low-noise amplifier, or a variable gain amplifier. The bias network includes an adaptive bias circuit configured to generate a bias signal for the amplifier, and a coupling circuit configured to couple the adaptive bias circuit to the amplifier to enable provision of the bias signal to the amplifier, where the coupling circuit is configured so that an impedance of the coupling circuit is dependent on a power level of an input signal to be amplified by the amplifier (i.e., the coupling circuit is an adaptive coupling circuit).

Example 2 provides the bias network according to example 1, where the coupling circuit is configured so that, when the power level of the input signal is a first power level, the impedance of the coupling circuit is a first impedance, and, when the power level of the input signal is a second power level, higher than first power level, the impedance of the coupling circuit is a second impedance, lower than the first impedance.

Example 3 provides the bias network according to examples 1 or 2, where the coupling circuit includes an input, coupled to an output of the adaptive bias circuit, where the bias signal generated by the adaptive bias circuit is provided at the output of the adaptive bias circuit, and an output, coupled to an input to the amplifier.

Example 4 provides the bias network according to any one of the preceding examples, where the coupling circuit is configured to exhibit variable resistance or variable impedance that depends on the power level of the input signal.

Example 5 provides the bias network according to any one of the preceding examples, where the coupling circuit includes a transistor and a resistor coupled between a source terminal and a drain terminal of the transistor, and where a first S/D terminal of a pair of the source terminal and the drain terminal is coupled to the input of the amplifier and a second S/D terminal of the pair is coupled to the output of the bias circuit.

Example 6 provides the bias network according to example 5, where the first S/D terminal of the transistor is further coupled to the input signal.

Example 7 provides the bias network according to examples 5 or 6, where, during operation, a current flowing between the first S/D terminal and the second S/D terminal of the transistor is dependent on the power of the input signal.

Example 8 provides a bias network for an amplifier, where the amplifier may be one of a power amplifier (e.g., a Doherty amplifier, a class A amplifier, a class B amplifier, a class AB amplifier, or a class C amplifier), a linear amplifier, a low-noise amplifier, or a variable gain amplifier. The bias network includes a bias circuit configured to provide a bias signal at an output of the bias circuit, and a coupling circuit, coupled between the output of the bias circuit and an input of the amplifier. In such a bias network, the coupling circuit includes a transistor, the transistor includes a source terminal and a drain terminal, a first one of the source terminal or the drain terminal of the transistor is coupled to the input of the amplifier and to a source of an input signal to be amplified by the amplifier, and a second one of the source terminal or the drain terminal of the transistor is coupled to the output of the bias circuit.

Example 9 provides the bias network according to example 8, where the transistor is an NMOS transistor, the coupling circuit further includes a power detector configured to determine a power of the input signal to be amplified by the amplifier, and a gate voltage to be applied to a gate terminal of the NMOS transistor is based on the power determined by the power detector.

Example 10 provides the bias network according to example 9, where an input of the power detector is coupled to the input signal, and an output of the power detector is coupled to the gate terminal of the NMOS transistor.

Example 11 provides the bias network according to example 10, where the coupling circuit further includes a resistor coupled between the source terminal and the drain terminal of the NMOS transistor.

Example 12 provides the bias network according to example 8, where the transistor is a PMOS transistor.

Example 13 provides the bias network according to example 12, where the coupling circuit further includes a resistor coupled between the source terminal and the drain terminal of the PMOS transistor.

Example 14 provides the bias network according to example 12, where the PMOS transistor is a first transistor of the coupling circuit, the coupling circuit further includes a second transistor, the second transistor being an NMOS transistor, the NMOS transistor includes a source terminal and a drain terminal, a first one of the source terminal or the drain terminal of the NMOS transistor is coupled to the first one of the source terminal or the drain terminal of the PMOS transistor (and, therefore also coupled to the input of the amplifier and to the source of the input signal to be amplified by the amplifier), and a second one of the source terminal or the drain terminal of the NMOS transistor is coupled to the second one of the source terminal or the drain terminal of the PMOS transistor (and, therefore also coupled to the output of the bias circuit).

Example 15 provides the bias network according to example 14, where the coupling circuit further includes a power detector configured to determine a power of the input signal to be amplified by the amplifier, and a gate voltage to be applied to a gate terminal of the NMOS transistor is based on the power determined by the power detector.

Example 16 provides the bias network according to example 15, where the coupling circuit further includes a resistor, the resistor includes a first end and a second end, the first end of the resistor is coupled to each of the first one of the source terminal or the drain terminal of the NMOS transistor and to the first one of the source terminal or the drain terminal of the PMOS transistor, and the second end of the resistor is coupled to each of the second one of the source terminal or the drain terminal of the NMOS transistor and to the second one of the source terminal or the drain terminal of the PMOS transistor.

Example 17 provides a bias network for an amplifier such as a power amplifier (e.g., a Doherty amplifier, a class A amplifier, a class B amplifier, a class AB amplifier, or a class C amplifier), a linear amplifier, a low-noise amplifier, or a variable gain amplifier. The bias network includes a bias circuit configured to generate a bias signal, and a coupling circuit, coupled between an output of the bias circuit and an input of the amplifier to enable provision of the bias signal from the bias circuit to the amplifier, where an impedance of the coupling circuit is dependent on a power level of an input signal to be amplified by the amplifier.

Example 18 provides the bias network according to example 17, where the bias network is a bias network according to any one of the preceding examples, e.g., according to any one of examples 1-16.

Example 19 provides a radio frequency device that includes an amplifier and a bias network for the amplifier, the bias network including an adaptive bias circuit configured to generate a bias signal for the amplifier, and a coupling circuit configured to provide a modified bias signal to the amplifier, where the modified bias signal is based on the bias signal generated by the adaptive bias circuit and further based on a power level of an input signal to be amplified by the amplifier.

Example 20 provides the RF device according to example 19, where the amplifier is one of a power amplifier (e.g., a Doherty amplifier, a class A amplifier, a class B amplifier, a class AB amplifier, or a class C amplifier), a linear amplifier, a low-noise amplifier, or a variable gain amplifier.

Example 21 provides the RF device according to examples 19 or 20, where the radio frequency device is a mobile device (e.g., a UE of a wireless cellular network).

Example 22 provides the RF device according to examples 19 or 20, where the radio frequency device is a base station of a wireless cellular network or a transmitter of a cable communications network.

Example 23 provides the RF device according to any one of examples 19-22, where the bias network is a bias network according to any one of the preceding examples, e.g., according to any one of examples 1-18.

Example 24 provides a method of operating a radio frequency device that includes an amplifier. The method includes providing a bias network that includes a bias circuit and a coupling circuit; controlling the bias circuit to generate a bias signal for the amplifier; controlling the coupling circuit to generate a modified bias signal, based on the bias signal generated by the bias circuit, where the modified bias signal is further based on an impedance of the coupling circuit, and the coupling circuit is configured so that the impedance of the coupling circuit is dependent on a power level of an input signal to be amplified by the amplifier; and controlling the amplifier to amplify the input signal while the amplifier is biased by a signal based on the modified bias signal.

Example 25 provides the method according to example 24, where the bias network is a bias network according to any one of the preceding examples, e.g., according to any one of examples 1-18, and/or the radio frequency device is a radio frequency device according to any one of the preceding examples, e.g., according to any one of examples 19-23.

Example 26 provides a non-transitory computer-readable storage medium including instructions for execution which, when executed by a processor, are operable to perform operations of the method according to examples 24 or 25.

In further examples, the non-transitory computer-readable storage medium according to example 26 may further include instructions operable to perform operations performed by any parts of the bias network and/or a radio frequency device according to any one of the preceding examples.

Variations and Implementations

While embodiments of the present disclosure were described above with references to exemplary implementations as shown in FIGS. 1-9, a person skilled in the art will realize that the various teachings described above are applicable to a large variety of other implementations. For example, descriptions provided herein are applicable not only to power amplifiers, which served as one particular example in order to illustrate embodiments of the present disclosure, but also to any other type of amplifiers such as low noise amplifiers, linear amplifiers, or variable gain amplifiers. In another example, descriptions provided herein are applicable not only to 5G systems, which provide one example of wireless communication systems (in particular, an example of high-frequency/short wavelength spectrum, e.g., with frequencies in the range between about 20 and 60 GHz, corresponding to wavelengths in the range between about 5 and 15 millimeters), but also to other wireless communication systems such as, but not limited to, Wi-Fi technology (e.g., a frequency band of 2.4 GHz, corresponding to a wavelength of about 12 cm, or a frequency band of 5.8 GHz, spectrum, corresponding to a wavelength of about 5 cm) or Bluetooth technology (e.g., a frequency band from about 2.4 to about 2.485 GHz, corresponding to a wavelength of about 12 cm). In yet another example, descriptions provided herein are applicable not only to wireless communication systems, but also to any other systems where amplifiers may be used, such as radar systems, automotive radar, and cable communication systems (e.g., cable television systems, etc.).

In certain contexts, the features discussed herein can be applicable to automotive systems, medical systems, scientific instrumentation, wireless and wired communications, radio, radar, and digital-processing-based systems.

In the discussions of the embodiments above, components of a system, such as phase shifters, frequency mixers, transistors, resistors, capacitors, power detectors, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to bias networks that use adaptive coupling circuits to provide modified bias signals to power amplifiers as described herein.

Parts of various systems for implementing bias networks that use adaptive coupling circuits to provide modified bias signals to power amplifiers as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-9) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to realizing bias networks that use adaptive coupling circuits to provide modified bias signals to power amplifiers as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. A radio frequency device, comprising:
a bias network for an amplifier, the bias network including:
a bias circuit, configured to generate a bias signal for the amplifier, and
a coupling circuit, configured to couple the bias circuit to the amplifier to enable provision of the bias signal to the amplifier,
wherein:
the coupling circuit includes a transistor and a resistor,
the resistor is coupled between a source terminal and a drain terminal of the transistor,
a first source or drain (S/D) terminal of a pair of the source terminal and the drain terminal of the transistor is to couple to an input of the amplifier and a second S/D terminal of the pair is to couple to an output of the bias circuit, and
the coupling circuit is configured so that, during operation, a current between the first S/D terminal and the second S/D terminal of the transistor is dependent on a power level of an input signal to be amplified by the amplifier.

2. The radio frequency device according to claim 1, wherein the coupling circuit is configured so that:
when the power level of the input signal to be amplified by the amplifier is at a first power level, the impedance of the coupling circuit is a first impedance, and
when the power level of the input signal is at a second power level, higher than first power level, the impedance of the coupling circuit is a second impedance, lower than the first impedance.

3. The radio frequency device according to claim 1, wherein the coupling circuit includes:
an input, to couple to the output of the bias circuit, and
an output, to couple to the input to the amplifier.

4. The radio frequency device according to claim 1, wherein the coupling circuit has a variable resistance that depends on the power level of the input signal.

5. The radio frequency device according to claim 1, wherein the first S/D terminal of the transistor is further coupled to an input signal to be amplified by the amplifier.

6. A radio frequency device, comprising:
a bias network for an amplifier, the bias network including:
  a bias circuit, configured to provide a bias signal at an output of the bias circuit; and
  a coupling circuit, comprising a transistor and a power detector, the coupling circuit to be coupled between the output of the bias circuit and an input of the amplifier,
wherein, during operation:
  a first source or drain (S/D) terminal of a pair of a source terminal and a drain terminal of the transistor is coupled to the input of the amplifier and to an input signal to be amplified by the amplifier,
  a second S/D terminal of the pair is coupled to the output of the bias circuit,
  the power detector is configured to determine a power of the input signal to be amplified by the amplifier, and
  a gate voltage applied to a gate terminal of the transistor is based on the power.

7. The radio frequency device according to claim 6, wherein the transistor is an N-type metal-oxide semiconductor (NMOS) transistor.

8. The radio frequency device according to claim 6, wherein:
an input of the power detector is coupled to the input signal, and
an output of the power detector is coupled to the gate terminal of the transistor.

9. The radio frequency device according to claim 8, wherein the coupling circuit further includes a resistor coupled between the source terminal and the drain terminal of the transistor.

10. The radio frequency device according to claim 6, wherein:
the transistor is a P-type metal-oxide semiconductor (PMOS) transistor,
the PMOS transistor is a first transistor of the coupling circuit,
the coupling circuit further includes a second transistor, the second transistor being an N-type metal-oxide semiconductor (NMOS) transistor,
the NMOS transistor includes a source terminal and a drain terminal,
a first source or drain (S/D) terminal of a pair of a source terminal and a drain terminal of the NMOS transistor is coupled to the first S/D terminal of the PMOS transistor, and
a second S/D terminal of the pair of the source terminal and the drain terminal of the NMOS transistor is coupled to the S/D terminal of the PMOS transistor.

11. The radio frequency device according to claim 10, wherein:
the coupling circuit further includes a resistor,
the resistor includes a first terminal and a second terminal,
the first terminal of the resistor is coupled to the first S/D terminal of the NMOS transistor and to the first S/D terminal of the PMOS transistor, and
the second terminal of the resistor is coupled to the second S/D terminal of the NMOS transistor and to the second S/D terminal of the PMOS transistor.

12. The radio frequency device according to claim 1, further comprising the amplifier.

13. The radio frequency device according to claim 12, wherein the amplifier is one of a power amplifier, a Doherty amplifier, a class A amplifier, a class B amplifier, a class AB amplifier, a class C amplifier, a linear amplifier, a low-noise amplifier, or a variable gain amplifier.

14. The radio frequency device according to claim 1, where the radio frequency device is a beamformer.

15. The radio frequency device according to claim 1, where the radio frequency device is a mobile device.

16. The radio frequency device according to claim 1, where the radio frequency device is a base station of a wireless cellular network or a transmitter of a cable communications network.

17. The radio frequency device according to claim 6, further comprising the amplifier.

18. The radio frequency device according to claim 17, wherein the amplifier is one of a power amplifier, a Doherty amplifier, a class A amplifier, a class B amplifier, a class AB amplifier, a class C amplifier, a linear amplifier, a low-noise amplifier, or a variable gain amplifier.

19. The radio frequency device according to claim 6, where the radio frequency device is a beamformer.

20. The radio frequency device according to claim 6, where the radio frequency device is a mobile device.

21. The radio frequency device according to claim 6, where the radio frequency device is a base station of a wireless cellular network or a transmitter of a cable communications network.

22. A method of operating a radio frequency device, the method comprising:
causing a bias circuit to generate a bias signal;
causing a coupling circuit to couple the bias circuit to an amplifier to enable provision of the bias signal to the amplifier,
wherein:
  the coupling circuit includes a transistor and a resistor,
  the resistor is coupled between a source terminal and a drain terminal of the transistor,
  when the coupling circuit couples the bias circuit to the amplifier, a first source or drain (S/D) terminal of a pair of the source terminal and the drain terminal of the transistor is coupled to an input of the amplifier and a second S/D terminal of the pair is coupled to an output of the bias circuit, and
  the coupling circuit is configured so that:
    when a power level of an input signal to be amplified by the amplifier is at a first power level, the impedance of the coupling circuit is a first impedance, and
    when the power level of the input signal is at a second power level, higher than first power level, the impedance of the coupling circuit is a second impedance, lower than the first impedance.

23. The method according to claim 22, where the radio frequency device is a beamformer.

24. The method according to claim 22, where the radio frequency device is a base station of a wireless cellular network or a transmitter of a cable communications network.

* * * * *